US010193026B2

(12) United States Patent
Rudmann et al.

(10) Patent No.: US 10,193,026 B2
(45) Date of Patent: Jan. 29, 2019

(54) PARTIAL SPACERS FOR WAFER-LEVEL FABRICATED MODULES

(71) Applicant: Heptagon Micro Optics Pte. Ltd., Singapore (SG)

(72) Inventors: Hartmut Rudmann, Jona (CH); Susanne Westenhöfer, Wettswil (CH); Simon Gubser, Weesen (CH)

(73) Assignee: Heptagon Micro Optics Pte. Ltd., Singapore (SG)

( * ) Notice: Subject to any disclaimer, the term of this patent is extended or adjusted under 35 U.S.C. 154(b) by 0 days.

(21) Appl. No.: 15/027,637

(22) PCT Filed: Oct. 1, 2014

(86) PCT No.: PCT/SG2014/000459
§ 371 (c)(1),
(2) Date: Apr. 6, 2016

(87) PCT Pub. No.: WO2015/053706
PCT Pub. Date: Apr. 16, 2015

(65) Prior Publication Data
US 2016/0247976 A1 Aug. 25, 2016

Related U.S. Application Data

(60) Provisional application No. 61/888,179, filed on Oct. 8, 2013.

(51) Int. Cl.
*H01L 33/48* (2010.01)
*H01L 27/146* (2006.01)
(Continued)

(52) U.S. Cl.
CPC ...... *H01L 33/483* (2013.01); *H01L 27/14618* (2013.01); *H01L 27/14627* (2013.01);
(Continued)

(58) Field of Classification Search
CPC ....... H01L 2924/0002; H01L 27/14685; H01L 2924/00; H01L 2251/566; H01L 27/14618;
(Continued)

(56) References Cited

U.S. PATENT DOCUMENTS

2006/0044450 A1* 3/2006 Wolterink ............ G02B 13/006
348/340
2006/0252167 A1 11/2006 Wang
(Continued)

FOREIGN PATENT DOCUMENTS

CN 100361317 1/2008
JP 2004-221200 8/2004
(Continued)

OTHER PUBLICATIONS

International Bureau of WIPO, International Preliminary Report on Patentability in International Patent Application No. PCT/SG2014/000459, dated Apr. 12, 2016.
(Continued)

*Primary Examiner* — Bilkis Jahan
*Assistant Examiner* — Victor Barzykin
(74) *Attorney, Agent, or Firm* — Fish & Richardson P.C.

(57) ABSTRACT

An optoelectronic module includes a cover substrate including a passive optical element, a base substrate including an optoelectronic device, and a spacer layer joining the cover substrate to the base substrate. The spacer layer includes multiple first spacer elements fixed to a surface of the cover substrate and multiple second spacer elements fixed to a surface of the base substrate, in which each first spacer element is joined to a corresponding second spacer element through an adhesive layer, and in which the cover substrate,
(Continued)

base substrate, and spacer layer define an interior region of the module in which the optical element is aligned with the optoelectronic device.

9 Claims, 10 Drawing Sheets

(51) Int. Cl.
    *H01L 31/0203*     (2014.01)
    *H01L 31/0232*     (2014.01)
    *H01L 33/58*     (2010.01)
    *H01L 33/60*     (2010.01)
    *H01S 5/02*     (2006.01)
    *H01S 5/183*     (2006.01)
    *H01L 51/52*     (2006.01)

(52) U.S. Cl.
    CPC .. *H01L 27/14629* (2013.01); *H01L 27/14685* (2013.01); *H01L 27/14687* (2013.01); *H01L 31/0203* (2013.01); *H01L 31/02325* (2013.01); *H01L 33/58* (2013.01); *H01L 33/60* (2013.01); *H01S 5/02* (2013.01); *H01S 5/183* (2013.01); *H01L 51/5225* (2013.01); *H01L 51/5275* (2013.01); *H01L 2251/566* (2013.01); *H01L 2924/0002* (2013.01); *H01L 2933/0033* (2013.01); *H01L 2933/0058* (2013.01)

(58) Field of Classification Search
    CPC ......... H01L 27/14627; H01L 27/14629; H01L 27/14687; H01L 2933/0033; H01L 2933/0058; H01L 31/0203; H01L 31/02325; H01L 33/483; H01L 33/58; H01L 33/60; H01L 51/5225; H01L 51/5275; H01S 5/02; H01S 5/183
See application file for complete search history.

(56) References Cited

U.S. PATENT DOCUMENTS

| | | | |
|---|---|---|---|
| 2009/0102959 A1* | 4/2009 | Chen | H01L 27/14618 348/340 |
| 2009/0166511 A1* | 7/2009 | Kwon | G01J 1/02 250/206 |
| 2011/0069216 A1* | 3/2011 | Lee | G02B 13/0035 348/340 |
| 2011/0220278 A1 | 9/2011 | Rudmann et al. | |
| 2012/0200946 A1* | 8/2012 | Wippermann | G02B 7/028 359/811 |
| 2012/0310043 A1* | 12/2012 | Hu | A61B 1/00018 600/109 |

FOREIGN PATENT DOCUMENTS

| | | | | |
|---|---|---|---|---|
| WO | WO 2011076634 A1 * | 6/2011 | | G02B 7/025 |
| WO | 2013/172786 | 11/2013 | | |
| WO | 2015/041602 | 3/2015 | | |

OTHER PUBLICATIONS

Australian Patent Office, International Search Report and Written Opinion, issued by ISA/AU in International Patent Application No. PCT/SG2014/000459 (dated Jan. 28, 2015).

* cited by examiner

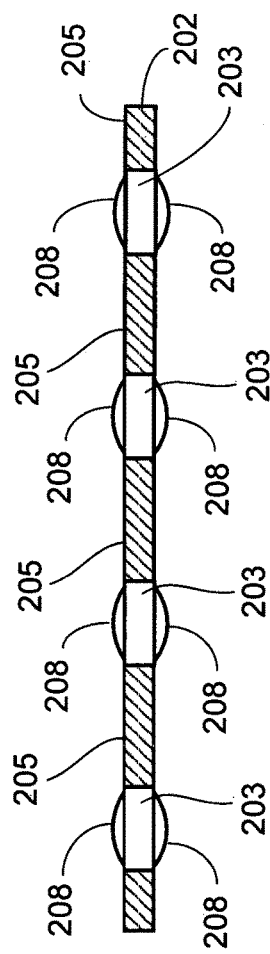

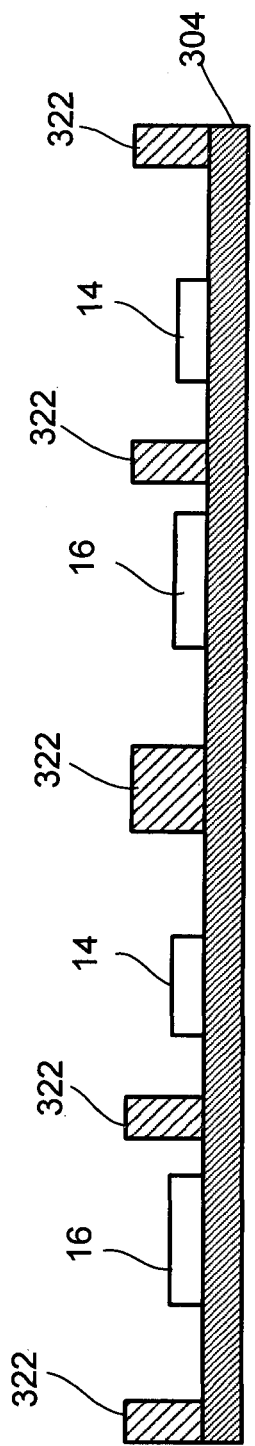
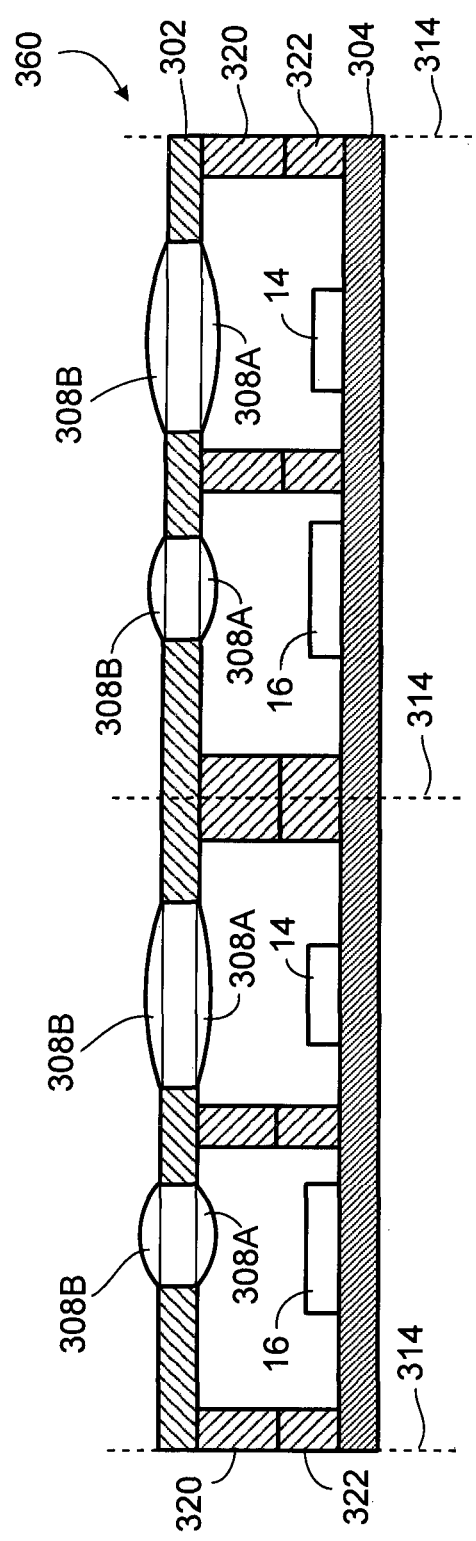

PARTIAL SPACERS FOR WAFER-LEVEL FABRICATED MODULES

FIELD OF THE DISCLOSURE

The present disclosure relates to partial spacers for wafer-level fabricated modules.

BACKGROUND

Smartphones and other devices sometimes include miniaturized optoelectronic modules such as light modules, sensors or cameras. Light modules can include a light emitting element such as a light emitting diode (LED), an infra-red (IR) LED, an organic LED (OLED), an infra-red (IR) laser or a vertical cavity surface emitting laser (VC-SEL) that emits light through a lens to outside the device. Other modules can include a light detecting element. For example, CMOS and CCD image sensors can be used in primary or front facing cameras. Likewise, proximity sensors and ambient light sensors can include a light sensing element such as a photodiode. The light emitting and light detecting modules as well as cameras can be used in various combinations. Thus, for example, a light module such as a flash module can be used in combination with a camera that has an imaging sensor. Light emitting modules in combination with light detecting modules also can be used for other applications such as gesture recognition or IR illumination.

In typical implementations, the light emitting or light sensing elements are positioned in interior areas of the module. The individual areas are bounded by a substrate, a cover and a spacer defining the walls of the interior area, in which the spacer is formed as a single integral and contiguous component between the substrate and the cover.

SUMMARY

In a first aspect, the subject matter of the present disclosure can be embodied in an optoelectronic module that includes a cover substrate including a passive optical element, a base substrate including an optoelectronic device, and a spacer layer joining the cover substrate to the base substrate. The spacer layer includes multiple first spacer elements fixed to a surface of the cover substrate and multiple second spacer elements fixed to a surface of the base substrate, in which each first spacer element is joined to a corresponding second spacer element through an adhesive layer, and in which the cover substrate, base substrate, and spacer layer define an interior region of the module in which the optical element is aligned with the optoelectronic device.

The optoelectronic module can include one or more of the following features. For example, in some implementations, the cover substrate includes a transparent region that is transparent to a specified wavelength or range of wavelengths of light, and the optical element is arranged on the transparent region.

In some implementations, the passive optical element includes a lens, mirror, or a diffuser. The optoelectronic device may include a light emitting element that is configured to emit light having the specified wavelength or range of wavelengths or a light sensing device configured to sense light having the specified wavelength or range of wavelengths.

In some implementations, the adhesive layer includes an epoxy or polydimethylsiloxane (PDMS).

In some implementations, a height of one or more of the first spacer elements is different from a height of one or more of the second spacer elements.

In some implementations, the first spacer elements are part of a single contiguous wafer.

In some implementations, the second spacer elements are part of a single contiguous wafer.

In some implementations, the first spacer elements are separate from one another.

In some implementations, the second spacer elements are separate from one another.

In some implementations, the first spacer elements and the second spacer elements are composed of silicon.

In some implementations, the first spacer elements and the second spacer elements are composed of epoxy.

In some implementations, a height of the first spacer elements is between about 150 µm to about 400 µm, and wherein a height of the second spacer elements is between about 150 µm to about 400 µm.

In some implementations, a thickness of the adhesive layer is between about 5 µm to about 300 µm.

In some implementations, the optoelectronic module further includes a functional layer between the multiple first spacer elements and the multiple second spacer elements.

The functional layer can include multiple through-holes, in which each through-hole is aligned with an optical axis of one or more of the optical elements. The functional layer can be composed of silicon or epoxy.

In another aspect, the subject matter of the present disclosure can be embodied in wafer-level methods of fabricating multiple optoelectronic device modules, in which the methods include providing a cover substrate that includes transparent regions, the cover substrate having a respective passive optical element on each transparent region, providing multiple first spacer elements on a surface of the cover substrate, in which adjacent passive optical elements are separated from one another by a respective first spacer element, providing a base substrate including a surface on which are mounted multiple optoelectronic devices, providing multiple second spacer elements on the surface of the base substrate, in which adjacent optoelectronic devices are separated from one another by a respective second spacer element, attaching each first spacer element on the cover substrate to a corresponding second spacer element on the base substrate to form a wafer stack, such that each passive optical element is aligned with a corresponding one of the optoelectronic devices, and separating the wafer stack into multiple optoelectronic device modules, in which each optoelectronic device module includes at least one of the passive optical elements and at least one of the optoelectronic devices.

The methods can include one or more of the following features. For example, in some implementations, each passive optical element includes a lens, mirror or a diffuser, and each optoelectronic device includes a light emitting element or a light sensing element.

In some implementations, providing the multiple first spacer elements includes attaching a first spacer wafer to the cover substrate to provide the first spacer elements on the cover substrate.

In some implementations, providing the multiple second spacer elements includes attaching a second spacer wafer to the base substrate to provide the second spacer elements on the base substrate.

In some implementations, providing multiple first spacer elements includes forming the first spacer elements on the cover substrate by using a vacuum injection technique.

In some implementations, providing multiple second spacer elements includes forming the second spacer elements on the base substrate by using a vacuum injection technique.

In some implementations, the wafer-level methods further include forming the passive optical elements on the transparent regions by a replication technique.

In some implementations, attaching the first spacer element on the cover substrate to the corresponding second spacer element on the base substrate includes applying an adhesive to a free end of the first spacer element and/or a free end of the corresponding second spacer element.

In some implementations, applying the adhesive includes applying a layer of polydimethylsiloxane (PDMS) to the free end of each first spacer element and/or to the free end of each second spacer element, and curing the layer of PDMS to bond the first spacer element to the corresponding second spacer element.

In some implementations, applying the adhesive includes applying a layer of ultraviolet (UV) curable epoxy or heat curable epoxy to the free end of each first spacer element, and/or to the free end of each second spacer element, and curing the layer of UV curable epoxy or heat curable epoxy to bond the first spacer element to the corresponding second spacer element.

In some implementations, attaching each first spacer element on the cover substrate to a corresponding second spacer element on the base substrate to form a wafer stack further includes providing a functional layer between the first spacer element and the corresponding second spacer element. The functional layer can include multiple through-holes. Providing the functional layer can include aligning each through-hole with an optical axis of a corresponding optical element. The methods can further include bonding a first side of the functional layer-to the multiple first spacer elements, and bonding a second opposite side of the functional layer to the multiple second spacer elements.

The details of one or more embodiments are set forth in the accompanying drawings and the description below. Other features and advantages will be apparent from the description, the drawings, and the claims.

BRIEF DESCRIPTION OF DRAWINGS

FIGS. 2A-2E are schematics illustrating a wafer-level fabrication process for making optoelectronic modules.

FIGS. 3A-3E are schematics illustrating a wafer-level fabrication process for forming optical elements and spacer elements.

DETAILED DESCRIPTION

Figure 1:
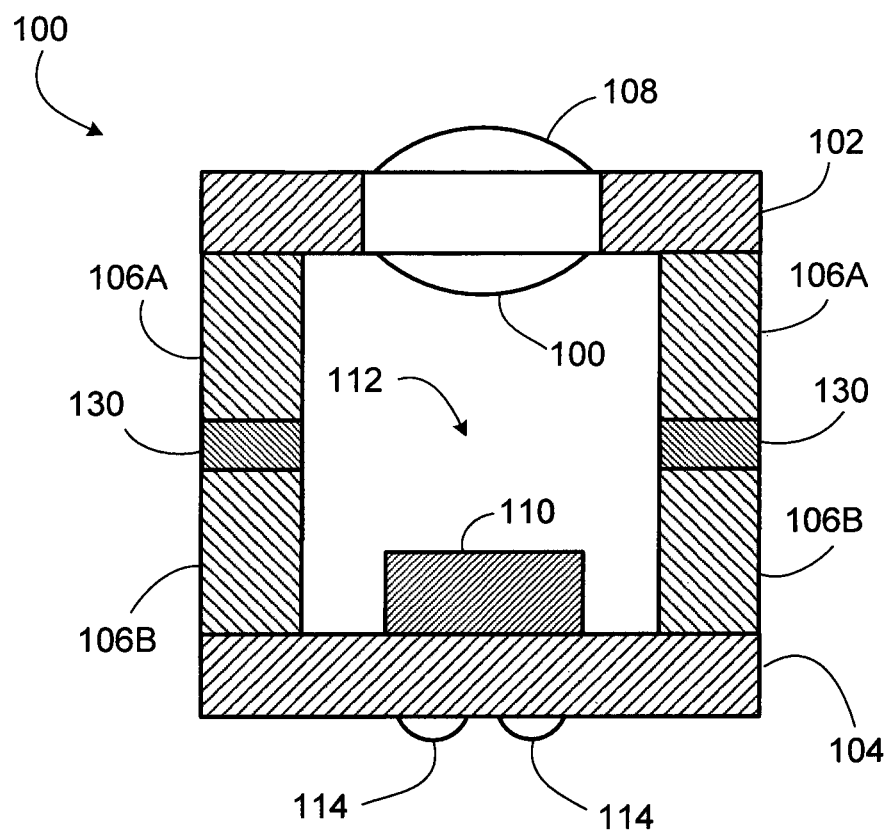
FIG. 1 is a schematic illustrating an example of an optoelectronic module.

The present disclosure describes various techniques for fabricating electronic modules, such as optoelectronic modules. An example of such a module is illustrated in FIG. 1, which shows a module 100 including a circuit device 110 mounted on a printed circuit board (PCB) or other substrate 104. Examples of the circuit devices 110 include an optoelectronic device, such as a light emitting element (e.g. a LED, an IR LED, an IR laser or a VCSEL), a light detecting element (e.g., a photodiode or other image sensor). Other circuit devices can be used as well. In some implementations, an integrated circuit (IC) device arranged outside of the module is electrically coupled to the circuit device 110 (e.g., through contact pads, conductive vias, and/or wire bonding). In the present example, the circuit device 110 is assumed to be an optoelectronic device.

A cover 102 composed, for example, of a semiconductor (e.g., silicon), glass, sapphire, polymer or PCB material (e.g., FR4 or G10), is separated from substrate 104 by spacers 106A, 106B. Spacers 106A, 106B surround the optoelectronic devices 110 and serve as sidewalls for the module, forming interior areas 112 (e.g., optical channels) in which one or more of the optoelectronic devices 110 may be positioned. Each of the top layers of spacers 106A is joined to a corresponding one of the lower layer spacer 106B through an adhesive 130. Spacers 106A and spacers 106B have a height that represents only part of the overall separation between the substrate 104 and the cover 102. Cover 102 can include passive optical elements 108, such as a lens (diffractive, refractive or Fresnel lens), mirror or diffuser. In the illustrated example, the devices 110 are optoelectronic devices, and the optical elements 108 are composed of a material that is generally transparent to wavelengths of light emitted or detectable by the optoelectronic devices 110. In some implementations, the optical elements 108 may be positioned on the top and/or bottom surface of the cover 102 and aligned with a transparent portion of the cover 102. For example, a first optical element may be disposed on an exterior surface of the cover 102 facing away from the interior area 112, whereas a second optical element may be disposed on an interior surface of the cover 102 facing the interior area 112. Light emitted by an optoelectronic device 110 in the direction of an optical element 108 can pass through optical element 108, and thus through the cover 102, from the interior area 112 in which the device 110 is positioned. Alternatively, or in addition, light incident on an optical element 108 from above cover 102 can pass through the optical element 108 into the interior area 112 situated beneath the optical element 108. The exterior side of substrate 104 includes one or more solder balls or other conductive contacts 114, which can be coupled electrically to the optoelectronic devices 110 by way of conductive vias extending through substrate 104.

Preferably, light emitted from an optoelectronic device 110 (or light to be detected by the optoelectronic device 110 in the module) passes through the corresponding optical element 108 arranged above the device 110 and exits (or enters) through the cover 102 of the module 100. In some cases, however, light may inadvertently escape through the sides of the device and/or stray light may enter through the cover 102 without first passing through an optical element 108, which can be undesirable. To reduce leakage, the spacers 106A, 106B can be composed of a non-transparent material (e.g., such as epoxy with carbon black, dye, pigment, or inorganic filler). Likewise, the cover 102 may also include portions that are composed of a non-transparent material to block stray light that does not pass through the optical elements 108.

Multiple variations of the foregoing optoelectronic module and other similar modules are possible. For example, some modules can include multiples of the same type of optoelectronic devices and/or different types of optoelectronic devices (e.g., a light emitting element and a light detecting element). In this way, proximity-type sensor modules, for example, having a light emitter and a light detector can be fabricated. In some implementations, two or more optoelectronic devices are arranged in the same interior area or are also separated by a spacer. Some modules include, in addition to or in place of the optoelectronic devices, electronic devices such as micro-electro-mechanical systems (e.g., microphones).

The following paragraphs describe various fabrication techniques for manufacturing the foregoing optoelectronic modules and other similar modules. In some implementations, the modules are fabricated in a wafer-scale process so that multiple modules (e.g., hundreds or even thousands) can be manufactured at that same time.

As an example, FIG. 2A shows a wafer-scale optics structure 202 (e.g., a cover substrate) that includes replicated optical elements 208 on a wafer 201. Wafer 201 includes transparent regions 203 and non-transparent regions 205. Various techniques can be used to fabricate the wafer-scale optics structure 202. In some implementations, wafer 201 is composed, for example, of a transparent wafer, such as glass or a transparent polymer wafer, in which non-transparent regions 205 are formed. Alternatively, the wafer 201 can be composed of a non-transparent material (e.g., PCB material), in which openings are formed and filled with a transparent material. Depending on the material constituting wafer 201, the openings can be formed in the wafer using, for example, chemical etching techniques, trench dicing, or mechanical drilling. The optic elements 208 then are positioned on the wafer 201 using a replication technique. For example, a single tool can be used to form lenses or other optical elements 208 on one or both sides of the transparent wafer 201 using replication techniques, described in more detail below with respect to FIGS. 3A-3E. In some implementations, the material used to form lenses 208 is transparent (at least to wavelengths of light that are to be emitted from or detected by the module), whereas the material used to fill the openings in the wafer 201 is non-transparent. For example, the material filling the openings in wafer 201 can be composed of epoxy with carbon black or other dye, pigment or filler.

The cover substrate (e.g., optics structure 202) then is attached to a printed circuit board (PCB) or other base substrate on which are mounted multiple optoelectronic devices. The exterior surface of the base substrate can include one or more solder balls or other conductive contacts, which can be coupled electrically to the optoelectronic devices by way of conductive vias extending through the substrate. The base substrate and the cover substrate are attached using a spacer structure that separates the cover substrate from the base substrate. The result is a wafer stack that includes an array of optoelectronic devices on the base substrate, each of which is aligned with a respective optical element (e.g., lens) on the cover substrate. The spacer structure can be fabricated employing partial spacers: an upper spacer layer formed on the cover substrate and a separate lower spacer layer formed on the base substrate, prior to attaching the cover substrate to the base substrate. The upper spacer layer of the cover substrate then is aligned and fixed to the lower spacer layer of the base substrate.

As an example, FIG. 2B is a schematic that illustrates a cover substrate 202 (e.g., wafer-scale optics structure) and a separate base substrate 204 (e.g., PCB substrate) on which devices 210 (e.g., optoelectronic devices) are arranged. Additionally, an upper spacer layer composed of upper spacer elements 220 and a lower spacer layer composed of lower spacer elements 222 are fixed on the cover substrate 202 and the base substrate 204, respectively. Various techniques can be used to arrange the upper and lower spacer elements on the substrates. In a first technique, the upper spacer elements 220 and the lower spacer elements 222 are provided on the surface of the wafer 201 and the surface of base substrate 204, respectively, as pre-formed spacer wafers. The spacers are fixed to the wafer 201 and substrate 204 using an adhesive, such as glue. The spacer wafers can be composed of a non-transparent material (e.g., a silicon wafer or polymer containing carbon black). When pre-formed spacer wafers are used, the spacer elements are contiguously connected to one another as part of a single wafer in which through-holes have been formed. The through-holes provide openings in which either the optoelectronic devices or the optical elements can be arranged. The diameter of the through-holes can be between about 0.5 mm to about 2 mm. Alternatively, the through-holes may have a rectangular shape, with each side have a length between about 0.5 mm to about 2 mm.

Alternatively, in a second technique, the upper and lower spacer layers are formed using a vacuum injection tool. For example, in some implementations, a tool is positioned on the cover substrate 202 and/or the base substrate 204, in which the tool provides a spacer element mold into which a UV or thermally curable material is injected. After curing, the material (e.g., a non-transparent epoxy containing carbon black) hardens to form the spacer elements. Further details on the vacuum injection process are described below with respect to FIGS. 3A-3E. The height of the spacer elements, which is defined as the distance from the substrate surface on which the spacer element is arranged (excluding the thickness of any adhesive used to hold the spacer element in place) can be in the range of about 150 μm to about 400 μm. For example, the spacer elements can be about 200 μm tall, about 250 μm tall, about 300 μm tall, or about 350 μm tall. The length and width of the spacer elements can be in the range of about 100 to 500 microns (as measured along directions parallel to the substrate surface on which the spacers are arranged). In some implementations, the height of each spacer may correspond to about half the distance of the overall separation between the cover wafer and the base substrate. In other implementations, one of the spacer elements has a greater height than the corresponding spacer element to which it is fixed.

Figure 2C:
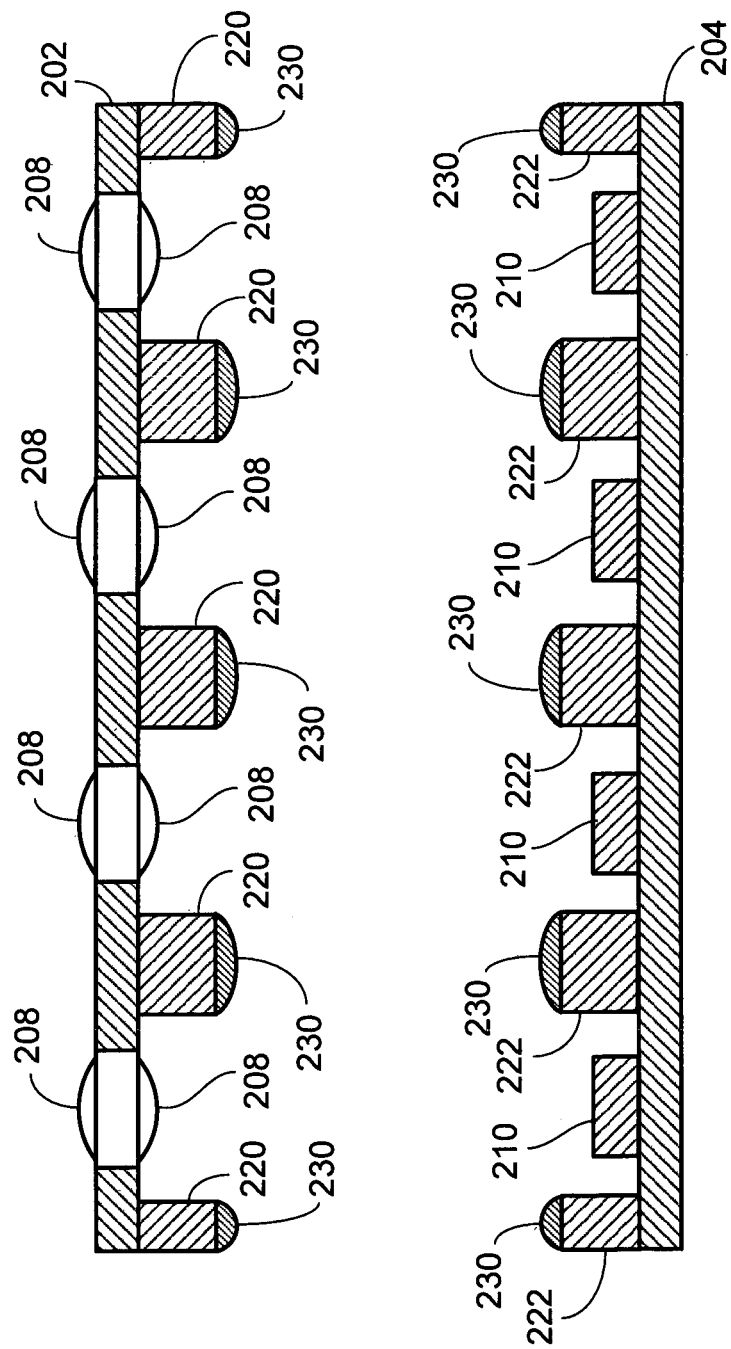

After forming the upper and lower spacer elements, each spacer element 220 from the cover substrate 202 is connected to a corresponding spacer element 222 of the base substrate, for example, using a thermally stable adhesive (e.g., glue, UV or heat-curable epoxy, or polydimethylsiloxane (PDMS)). The adhesive can be applied to the upper spacer elements 220, the lower spacer elements 222, or both. For example, FIG. 2C is a schematic illustration of a cover substrate 202 and base substrate 204, on which adhesive 230 has been applied to surfaces of the spacer elements on both the cover substrate 202 and base substrate 204. When using a glue or PDMS as the adhesive 230, the adhesive 230 is first deposited in liquid or solution form on surfaces of the spacer elements. The upper spacer elements 220 are joined to the lower spacer elements 222. The adhesive 230 then is cured, such that the adhesive 230 solidifies and fixes the cover substrate 202 to the base substrate 204. Depending on the material used, curing may require heating and/or exposing the adhesive to ultraviolet light. Examples of curable epoxies include UV10DCTK and UV15DC80 available from Masterbond®. Other epoxies also can be used. The thickness of the adhesive 230 can be in the range of about several microns to about several hundred microns. Accordingly, the overall separation distance between the cover substrate 202 and the base substrate 204, including the approximate thickness of the adhesive 230, is between about 300 μm to about 1100 μm. In some implementations, volatile organic compounds (VOCs) within the interior area created by joining the upper and lower spacer elements cause a decrease in the efficiency of the optoelectronic device (e.g., a reduction in light output by the light emitting device). To reduce or prevent this effect, a degassing process can be implemented prior to curing the polymer, in which the VOCs degas through the polymer. For example, the wafer stack can be placed in a low pressure environment (e.g., vacuum environment) such that the VOCs degas through the PDMS adhesive layer. With the VOCs removed, the reduction in efficiency of the optoelectronic device in the interior area can be avoided.

Figure 2D:
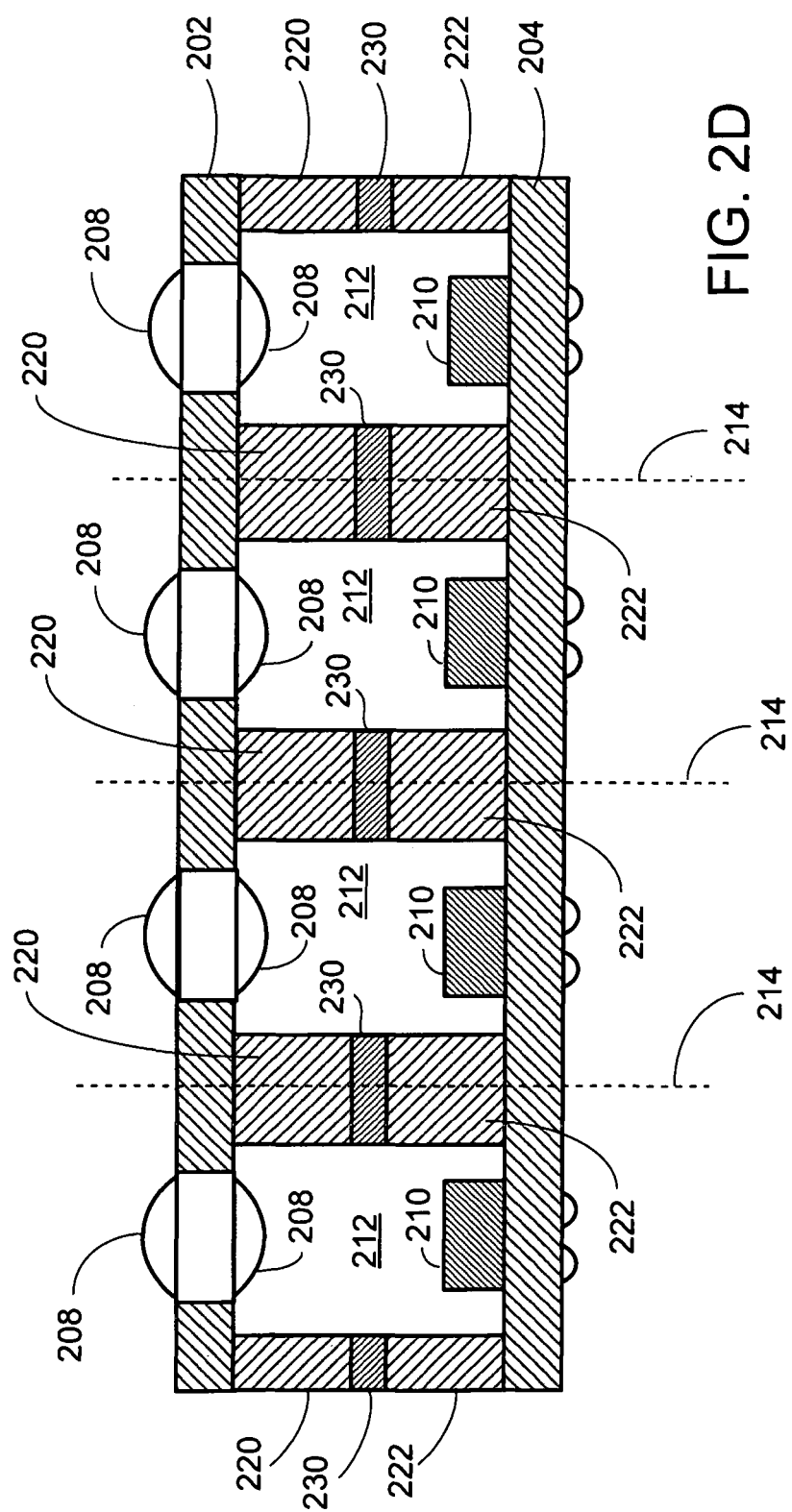

FIG. 2D is a schematic illustrating a wafer stack in which the cover substrate 202 is fixed to the base substrate 204 by joining a free end of each of the upper spacer elements 220 directly to a corresponding free end of one of the lower spacer elements 222. A thin cured adhesive layer 230 between the upper and lower spacer portions fixes the upper and lower portions together. The result is a wafer stack that includes an array of optoelectronic devices 210 each of which is aligned with a respective one of the optical elements 208 (e.g., lenses). The optoelectronic devices 210 and some of the optical elements 208 are contained in interior areas 212. The exterior surface of the base substrate 204 can include one or more solder balls or other conductive contacts, which can be coupled electrically to the optoelectronic devices by way of conductive vias extending through the substrate. Using such pre-formed wafers or vacuum injection techniques to form the upper and lower spacer elements can provide greater flexibility in the height of the module, as well as greater flexibility in the distance between the optoelectronic devices 210 and the optical elements 208 (e.g., lens).

Figure 2E:
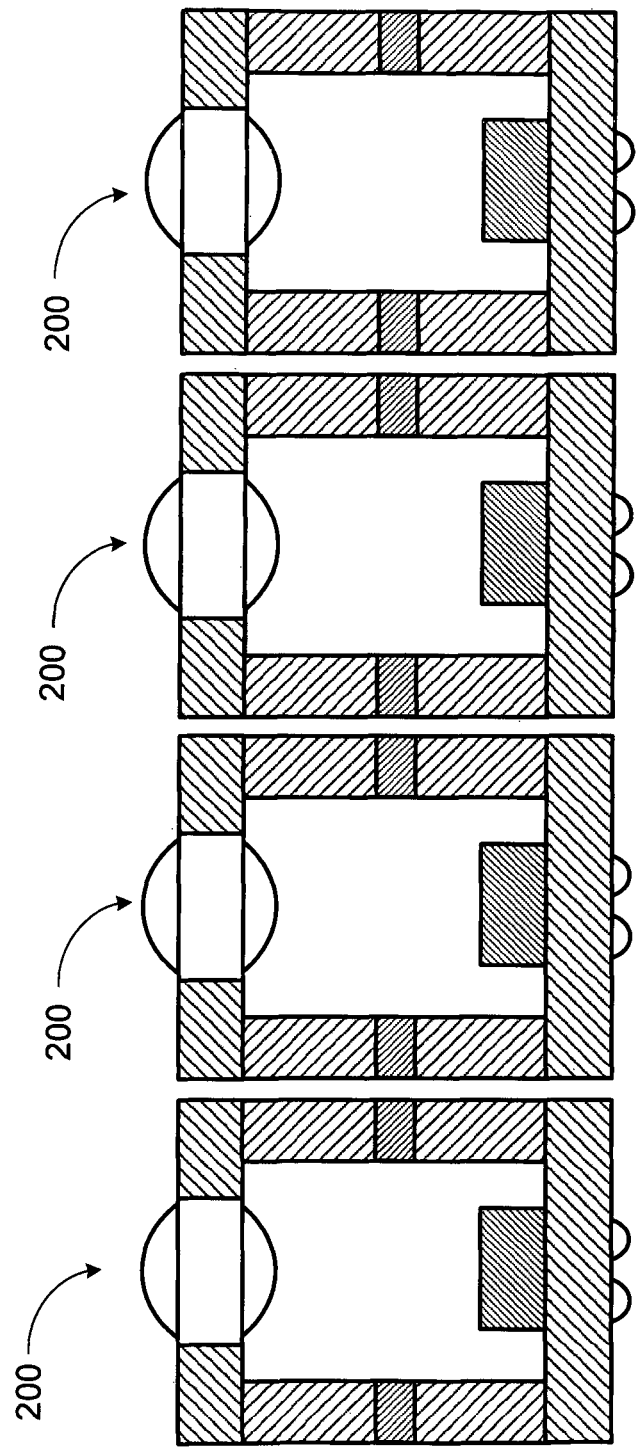

After fixing the cover substrate 202 to the base substrate 204, the wafer stack is separated along dicing lines 214 to form individual optoelectronic modules 200 each of which includes an optoelectronic device aligned with a lens element attached to a transparent cover (see FIG. 2E). In particular, trenches are formed at the dicing lines that extend through the cover substrate 202 and the base substrate 204. The trenches can be formed, for example, by dicing, micromachining or laser cutting techniques. Thus, the foregoing technique can be used to fabricate multiple modules 200 on a wafer-level scale.

In the illustrated example of FIGS. 2A-2E, the base substrate 204 (with the optoelectronic devices mounted on its surface) is attached to the spacer elements 222 after the optoelectronic devices are mounted to its surface. In other implementations, the spacer elements 222 can be attached to the base substrate 204 before the optoelectronic devices are mounted to its surface. Similarly, spacer element 220 can be attached to the cover substrate 202 before the optical elements 208 are mounted on the surface of the cover substrate 202.

As explained above, in some implementations, the partial spacer elements 220, 222 are provided by using spacer wafers, each of whose height represents about half the height of the overall separation between the substrate 204 and the cover 202 in the resulting wafer stack. As before, the spacer wafers include openings corresponding to the optical emission and/or detection channels in the modules. In some implementations, the height of the partial spacers 220 on the cover substrate 202 may differ from the height of the partial spacers 222 on the base substrate wafer 204. The partial spacers 220, 222 can be provided in other ways as well. For example, they can be formed directly on the base substrate 204 and the cover substrate 202 using a vacuum injection technique, as shown in FIGS. 3A-3E.

Figure 3A:
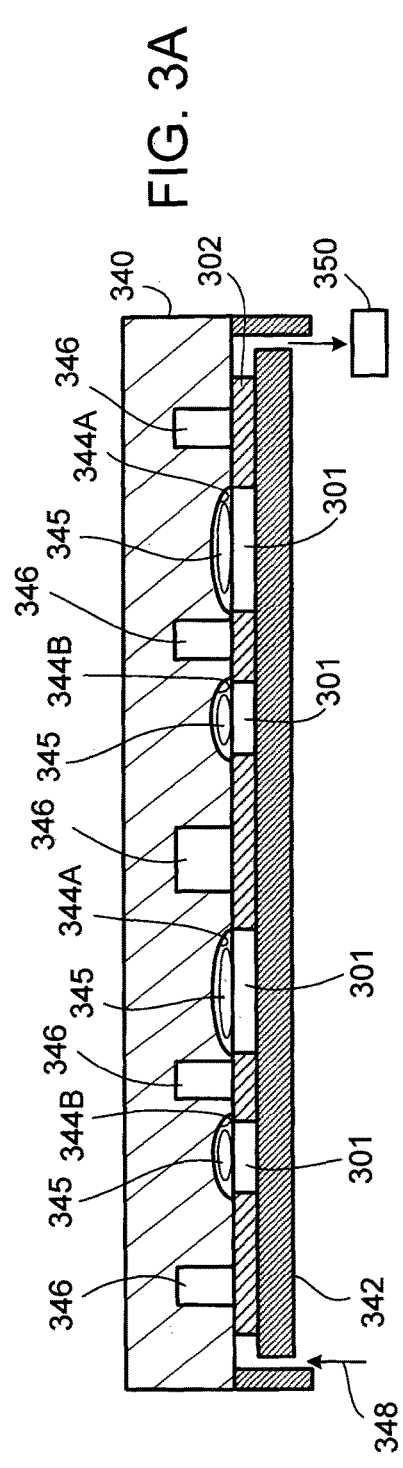
Figure 3B:
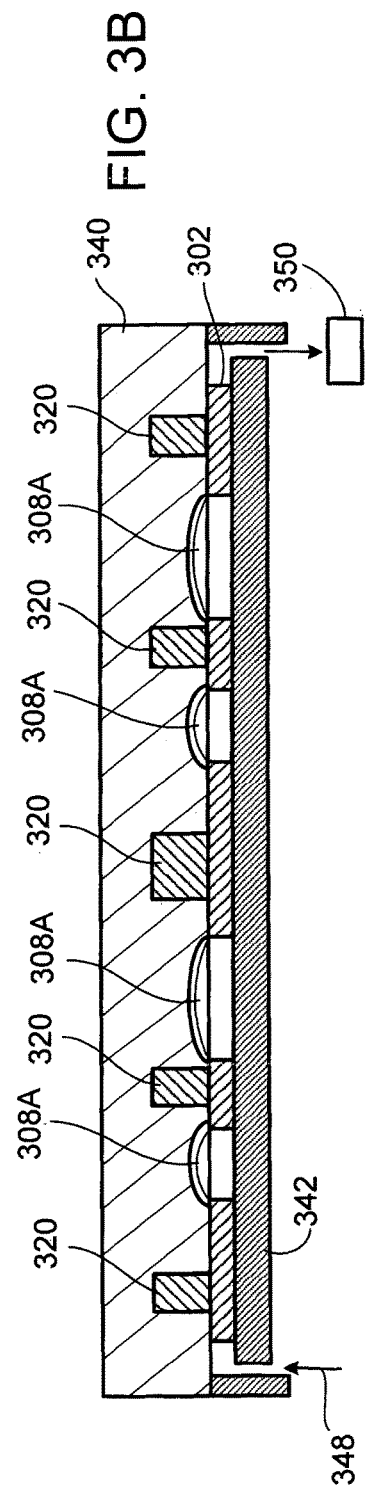

FIGS. 3A-3E illustrate a wafer-level process in which passive optical elements and partial spacers are formed on a cover substrate 302 using a combined replication and vacuum injection tool. As shown in FIG. 3A, a PDMS vacuum sealing chuck 342 and a combined replication and vacuum injection tool 340 are provided. The tool 340 includes lens replication regions 344A, 344B corresponding, respectively, to the locations of the transparent regions 301 of the cover substrate 302. The tool 340 also includes spacer replication regions 346 corresponding to the locations of the partial spacers 320. The dimensions of the lens replication regions 344A, 344B and the spacer replication regions 346 correspond, respectively, to the desired dimensions of the optical components 308A and the partial spacers 320 (see FIG. 3C).

As indicated by FIG. 3A, optical element structures (e.g., lenses) are replicated on the transparent regions 301 of the cover substrate 302 by providing a first replication material 345 on the lens replication regions 344A, 344B of the tool 340. The replication material 345 is capable of being brought from a liquid or plastically deformable state into a solid state. An example of the replication material is a UV- or thermally-curable transparent epoxy. The replication material 345 can be poured or dispensed onto the lens replication regions 344A, 344B of the tool 340. As shown in FIG. 3A, a cover substrate 302 is brought into contact with the surface of the tool 340 such that the lens replication regions 344A, 344B are over the transparent regions 301 of the cover substrate 302. This causes the replication material 345 to be pressed between the areas of the tool 340 defining the lens replication regions 344A, 344B and the surface of the cover substrate 302. The lens replication regions 344A, 344B are thereby embossed on the replication material 345 (see FIG. 3B).

Next, the first replication material 345 is cured (i.e., hardened), for example, by UV or thermal curing. In the case of UV-curable replication material, UV radiation is directed at the first replication material to harden the replication material. The UV radiation can be incident from the tool side (in which case the replication tool 340 needs to be transparent to the UV radiation) or from the optics wafer side. In the case of thermally-curable replication material, the injected material can be hardened by thermal curing.

To form the partial spacers 320 on the cover substrate 302, a second replication material is injected into an inlet 348 of the vacuum sealing chuck 342. The second replication material is capable of being brought from a liquid or plastically deformable state into a solid state. An example of the second replication material is a UV- or thermally-curable polymer that is substantially non-transparent to wavelengths of light emitted by the light emitting element 14 and/or detectable by light detecting elements 18. A vacuum pump 350 provided near the outlet 352 of the vacuum sealing chuck 342 facilitates the second replication material flowing into and filling the spacer replication regions 346 of the replication tool 340. In the case of UV-curable replication material, UV radiation is directed at the second replication material to cure (i.e., harden) the replication material. The UV radiation can be incident from the tool side (in which case the replication tool 340 needs to be transparent to the UV radiation) or from the cover substrate side. In the case of thermally-curable replication material, the injected material can be hardened by thermal curing. The injected replication material can form a continuous grid of spacer structure such that the replicated spacer elements 320 are formed on the non-transparent regions of the cover substrate 302.

Figure 3C:
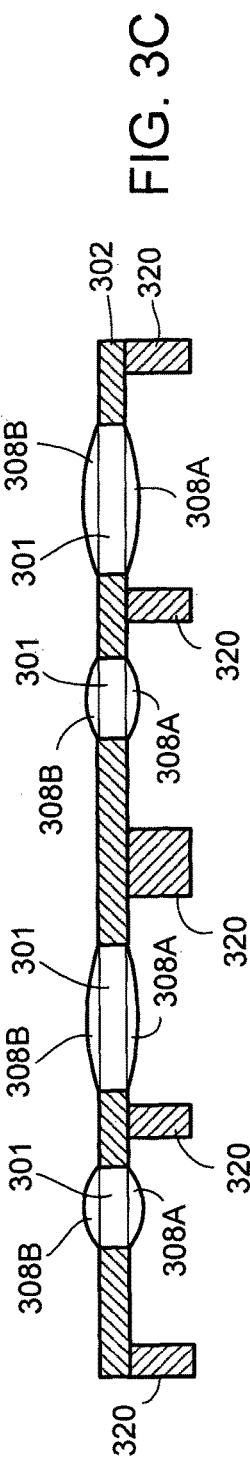

Following formation of the replicated lens elements 308A and the vacuum injected partial spacers 320, the cover substrate 302 is removed from the tool 340 (see FIG. 3C). In some implementations, a second set of lens elements 308B is formed on the second side of the transparent regions 301 of the cover substrate 302 (see FIG. 3C). The second set of lens elements 308B also can be formed, for example, by a replication technique.

As shown in FIG. 3D, partial spacers 322 are provided on the surface of base substrate 304. As explained above, the partial spacers 322 can be provided by attaching a spacer wafer (having openings corresponding to the optical emission and detection channels) to the base substrate 304. Alternatively, the partial spacers 322 can be replicated directly on the surface of the base substrate 304 using a vacuum injection technique. In some implementations, the tool 340 is used to form only the spacers 320, 322 or to form only the optical elements 308A, 308B. For example, in some cases, the optical elements 308A, 308B can be formed using a pick and place technique, whereas the spacers 320, 322 are formed by vacuum injection. Alternatively, in some cases, the spacers 320, 322 are provided by attaching spacer wafers to the cover and base substrates, whereas the optical elements 308A, 308B are provided using a replication technique.

Next, as shown in FIG. 3E, the cover substrate 302 and base substrate 304 are aligned and the free ends of the partial spacers 320, 322 are attached to one another (e.g., using an adhesive) to form a wafer stack 360. The wafer stack 360 then can be separated (e.g., by dicing) along lines 314 to form multiple optical encoder modules.

Figure 4:
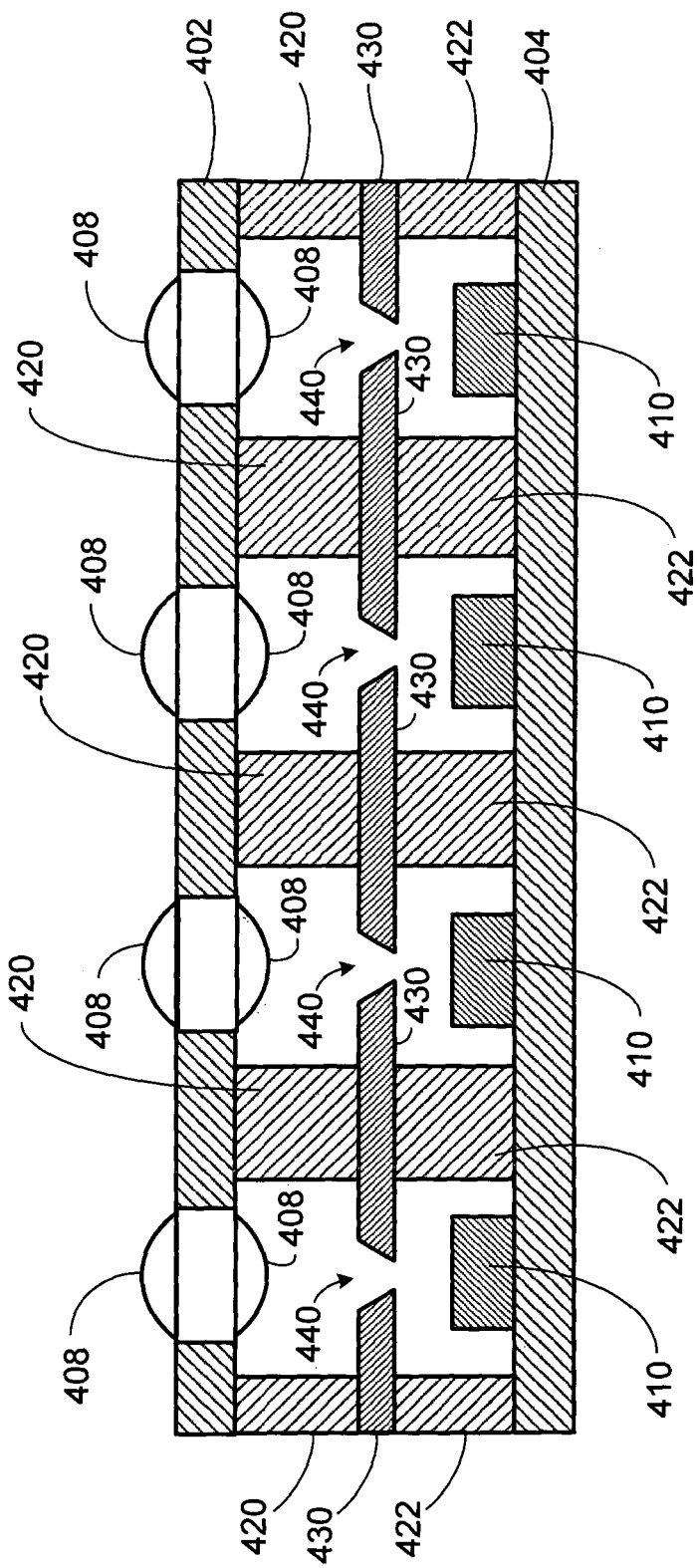
FIG. 4 is a schematic illustrating an example of an optoelectronic module.

In some implementations, the use of separate spacer layers on the cover substrate and the base substrate also allows incorporation of a functional layer between the upper spacer layer and the lower spacer layer. For example, FIG. 4 is a schematic illustrating a wafer stack that includes a cover substrate 402 fixed to a base substrate 404, in which the cover substrate 402 and the base substrate 404 are separated by an upper spacer layer composed of spacer elements 420 and a lower spacer layer composed of spacer elements 422. The wafer stack also includes a functional layer 430 arranged between the upper spacer layer and the lower spacer layer. In the present example, the functional layer 430 is a pre-formed wafer having multiple through-holes. Each through-hole provides an aperture 440 through which light emitted from the optoelectronic device 410 or light entering the module from optical element 408 passes. Apertures 440 can be useful in various optical systems including, for example, telecentric lens systems. In optical sensors, where the device 430 is an image sensor, the aperture 440 determines the cone angle of a bundle of rays that come to a focus on the image plane of the device 430. The size of the aperture 440 thus determines how collimated the admitted rays are that reach an image plane of an image sensor.

The functional layer 430 can be composed, for example, of a semiconductor (e.g., silicon), a printed circuit board or a polymer material (e.g., epoxy with carbon black). The thickness of the functional layer 430 can be in the range of about 100 microns to about 1600 microns. The holes in the functional layer 430 can be formed using, for example, chemical etching or mechanical drilling. During fabrication of the wafer stack, the functional layer 430 can be introduced before the cover substrate 402 and base substrate 404 are joined. For example, subsequent to forming the upper spacer layer on the cover substrate 402, a first side of the functional layer 430, which can be in the form of a wafer, is fixed to the spacer elements 420 using a thermally stable adhesive (e.g., glue or PDMS as previously described). The center of each through-hole in the functional layer 430 is aligned with an optical axis of a corresponding optical element 408 in the cover layer 402. The adhesive then is cured such that the functional layer 430 is immovably fixed to the spacer elements 420. Alternatively, the first side of the functional layer 430 can be fixed to the base substrate 404 through spacer elements 422 using the thermally stable adhesive in a similar manner. In the case optoelectronic devices (e.g., an image-sensor or light source) are present on the base substrate 404, each through-hole is aligned with either an image plane or emitting face of a corresponding optoelectronic device. The functional layer 430 can be fixed to the spacer elements 420 and the spacer elements 422 in any order. Again, alignment is performed to ensure that the through-holes of the functional layer 430 are properly positioned with respect to corresponding optical elements 408 or optoelectronic devices 410.

Figure 5A:
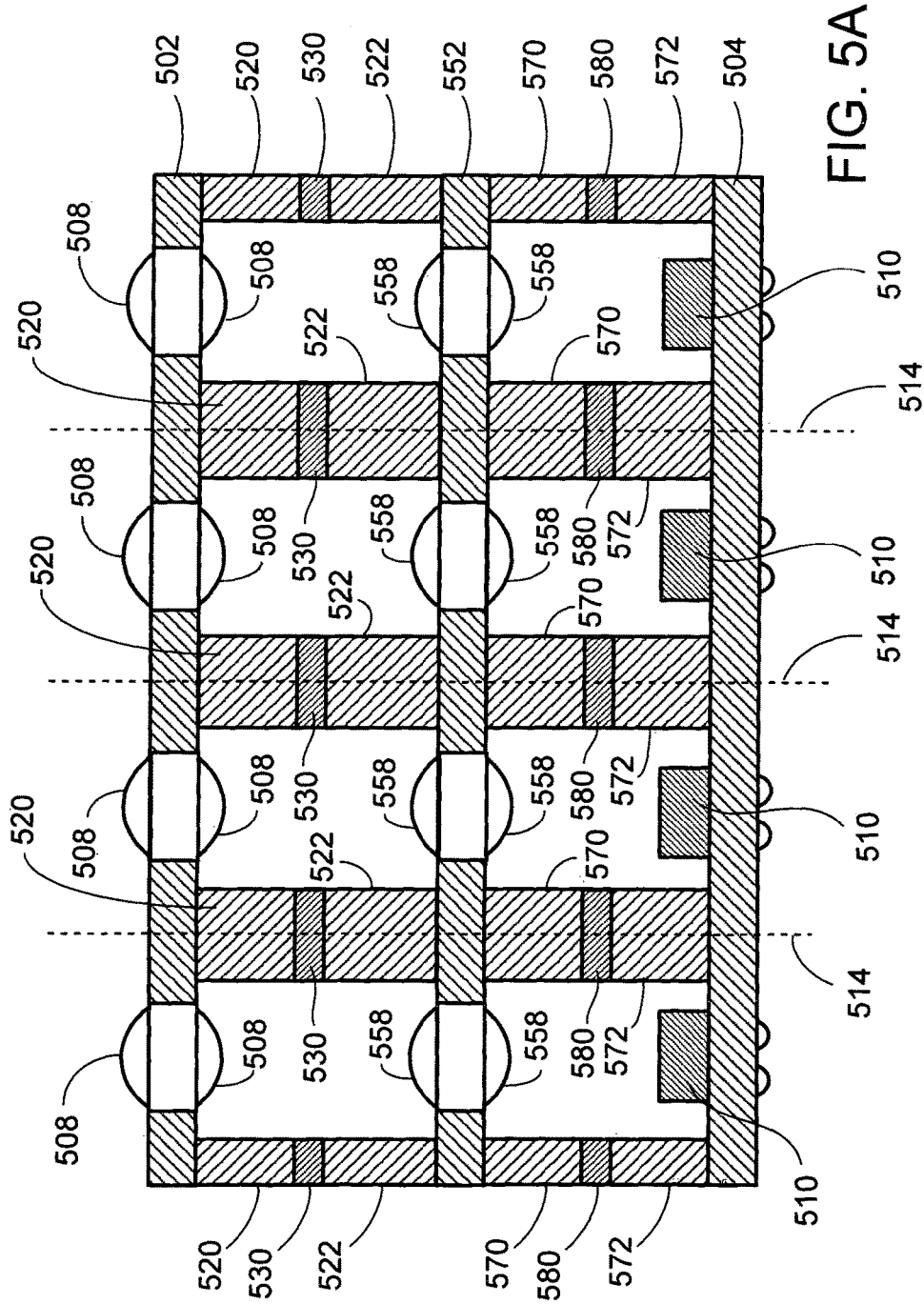
FIG. 5A is a schematic illustrating an example of a wafer stack.

Some modules (e.g., camera modules) can include a vertical stack of two or more cover substrates, each of which includes optical elements (e.g., lenses) on one or both sides. Separate spacer layers can be used to join each cover substrate to an adjacent cover substrate and/or to join the base substrate to a cover substrate. For example, FIG. 5A is a schematic that illustrates a wafer stack having two cover substrates 502, 552 that are joined using separate spacer layers. A first cover substrate 502 includes replicated optical elements 508 formed on one or both sides of its respective surfaces. An upper spacer layer composed of spacer elements 520 is fixed to a lower spacer layer 522 formed on a second cover substrate 552 through an adhesive layer 530 (e.g., glue, epoxy, or PDMS). The second cover substrate 552 also can include replicated optical elements 558 on one or both of its respective surfaces. The joined cover substrates are together fixed to the base substrate 504 through a second upper spacer layer 570 and second lower spacer layer 572. An adhesive layer 580 (e.g., glue, epoxy or PDMS) binds the upper layer 570 to the lower layer 572.

The spacer elements in each spacer layer can be provided, for example, as separate spacer wafers or by vacuum injection, as described above. In some implementations, a functional layer can be used in place of one or both of the adhesive layers 530, 580. The functional layer can include a wafer or printed circuit board having through-holes to form apertures as described above with respect to FIG. 5A. The base substrate 504 can include one or more devices 510 (e.g., optoelectronic devices) and may be composed of a printed circuit board or other substrate (e.g. silicon wafer).

Figure 5B:
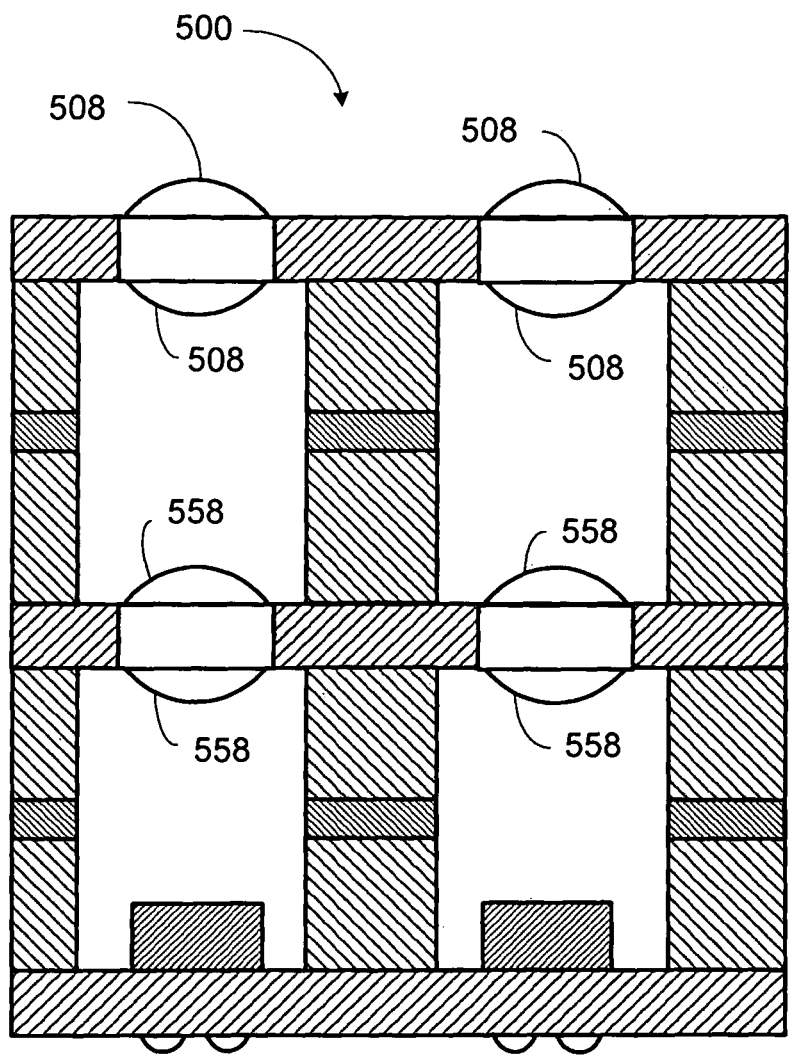
FIG. 5B is a schematic illustrating an example of an optoelectronic module.

Next, openings (e.g., trenches) are formed through the cover substrates 502, 552, and the base substrate 504 to separate the wafer stack into separate modules (e.g., optoelectronic modules). Trenches should extend entirely through the thickness of both cover substrates 502, 552, and the base substrate 504. The trenches can be formed, for example, by dicing, micromachining or laser cutting techniques along dicing lines 514. In the present example, each of the individual optoelectronic modules includes an image sensor 510 aligned with vertical stacks of optical elements 508, 558 attached to cover substrates. In some implementations, multiple vertical stacks of optical elements and image sensors are incorporated into the separated optoelectronic module to form an array camera (e.g., a 2×2 or any other M×N array). For example, FIG. 5B is a schematic illustrating a camera module 500 formed from the wafer stack of FIG. 5A, in which the module 500 includes a 4×4 array of optical elements 508, 558.

Although the foregoing examples include a single optoelectronic device (e.g., light emitting or light detecting element) in the interior region of each module, techniques similar to the foregoing techniques can be used to fabricate modules that include two or more optoelectronic devices (or other electronic devices) in an interior region, each of which is aligned with one or more respective optical elements. Such modules, which can include non-transparent sidewalls surrounding two or more optoelectronic devices without a spacer separating the light emitting elements from one another, can serve, for example, as dual LED flash modules. In some implementations, the modules also may include other optoelectronic or optical components.

In the context of this disclosure, when reference is made to a particular material or component being transparent, it generally refers to the material or component being substantially transparent to light emitted by a light emitting element housed in the module or detectable by a light detecting element housed in the module. Likewise, when reference is made to a particular material or component being non-transparent, it generally refers to the material or component being substantially non-transparent to light emitted by a light emitting element housed in the module or detectable by a light detecting element housed in the module.

Various modifications can be made within the spirit of the invention. Accordingly, other implementations are within the scope of the claims.

What is claimed is:

1. A wafer-level method of fabricating a plurality of optoelectronic device modules, the method comprising:
   providing a cover substrate that includes transparent regions, the cover substrate having a respective passive optical element on each transparent region;
   providing a plurality of first spacer elements on a surface of the cover substrate, wherein adjacent passive optical elements are separated from one another by a respective first spacer element;
   providing a base substrate including a surface on which are mounted a plurality of optoelectronic devices;
   providing a plurality of second spacer elements on the surface of the base substrate, wherein adjacent optoelectronic devices are separated from one another by a respective second spacer element;
   joining each first spacer element on the cover substrate directly to a corresponding one of the second spacer elements on the base substrate to form a wafer stack, each of the first spacer elements being fixed to a corresponding one of the second spacer elements by adhesive, such that each passive optical element is aligned with a corresponding one of the optoelectronic devices;
   degassing volatile organic compounds through the adhesive; and
   separating the wafer stack into a plurality of optoelectronic device modules, wherein each optoelectronic device module includes at least one of the passive optical elements and at least one of the optoelectronic devices.

2. The wafer-level method of claim 1, wherein each passive optical element comprises a lens, a mirror, or a diffuser, and wherein each optoelectronic device comprises a light emitting element or a light sensing element.

3. The wafer-level method of claim 1,
   wherein providing the plurality of first spacer elements comprises attaching a first spacer wafer to the cover substrate to provide the first spacer elements on the cover substrate; and
   wherein providing the plurality of second spacer elements comprises attaching a second spacer wafer to the base substrate to provide the second spacer elements on the base substrate.

4. The wafer-level method of claim 1,
   wherein providing the plurality of first spacer elements comprises forming the first spacer elements on the cover substrate by using a vacuum injection technique; and
   wherein providing the plurality of second spacer elements comprises forming the second spacer elements on the base substrate by using a vacuum injection technique.

5. The wafer-level method of claim 1, further comprising forming the passive optical elements on the transparent regions by a replication technique; and
   wherein joining each of the first spacer elements on the cover substrate to a corresponding second spacer element on the base substrate comprises applying an adhesive to a free end of the first spacer element and/or a free end of the corresponding second spacer element.

6. The wafer-level method of claim 5, wherein applying the adhesive comprises:
   applying a layer of polydimethylsiloxane (PDMS) to the free end of each first spacer element and/or to the free end of each second spacer element; and
   curing the layer of PDMS to bond the first spacer element to the corresponding second spacer element.

7. The wafer-level method of claim 5, wherein applying the adhesive comprises:
   applying a layer of ultraviolet (UV) curable epoxy or heat curable epoxy to the free end of each first spacer element and/or to the free end of each second spacer element; and
   curing the layer of UV curable epoxy or heat curable epoxy to bond the first spacer element to the corresponding second spacer element.

8. The wafer-level method of claim 6, wherein degassing volatile organic compounds through the adhesive occurs prior to curing the PDMS layer.

9. The wafer-level method of claim 1 wherein degassing volatile organic compounds through the adhesive includes placing the wafer stack in a low pressure environment.

* * * * *